(12) United States Patent
Funahashi et al.

(10) Patent No.: US 7,804,380 B2
(45) Date of Patent: Sep. 28, 2010

(54) ACOUSTIC WAVE DUPLEXER

(75) Inventors: Kentaro Funahashi, Omihachiman (JP); Ichiro Matsuda, Hakusan (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/622,603

(22) Filed: Nov. 20, 2009

(65) Prior Publication Data
US 2010/0060372 A1 Mar. 11, 2010

Related U.S. Application Data

(63) Continuation of application No. PCT/JP2008/057728, filed on Apr. 22, 2008.

(30) Foreign Application Priority Data
May 29, 2007 (JP) .............................. 2007-142314

(51) Int. Cl.
*H03H 9/70* (2006.01)
*H03H 9/72* (2006.01)
*H03H 9/52* (2006.01)

(52) U.S. Cl. ...................... 333/133; 333/189; 333/193

(58) Field of Classification Search ................ 333/133, 333/193, 195; 310/313 R, 313 B, 313 D
See application file for complete search history.

(56) References Cited

U.S. PATENT DOCUMENTS 6,930,570 B2 * 8/2005 Nakamura et al. .......... 333/193
7,242,268 B2 * 7/2007 Hagiwara et al. ........... 333/133
7,400,216 B2 * 7/2008 Fuse ........................... 333/133
7,446,629 B2 * 11/2008 Nakamura et al. .......... 333/133
7,684,764 B2 * 3/2010 Iwamoto et al. .............. 455/76
2004/0155730 A1 8/2004 Iwamoto et al.

FOREIGN PATENT DOCUMENTS

| EP | 1 453 198 A2 | 9/2004 |
| JP | 2003-249842 A | 9/2003 |
| JP | 2004-282707 A | 10/2004 |

OTHER PUBLICATIONS

Official Communication issued in International Patent Application No. PCT/JP2008/057728, mailed on Jun. 17, 2008.

* cited by examiner

*Primary Examiner*—Barbara Summons
(74) *Attorney, Agent, or Firm*—Keating & Bennett, LLP

(57) ABSTRACT

An acoustic wave duplexer has a satisfactory isolation characteristic between a reception acoustic wave filter chip and a transmission acoustic wave filter chip, and includes a reception surface acoustic wave filter chip and a transmission surface acoustic wave filter chip mounted on a substrate. The substrate includes first and second balanced terminals and a common terminal. At least one of the transmission surface acoustic wave filter chip and the reception surface acoustic wave filter chip is a balanced filter unit that includes, as an input terminal or an output terminal, a first balanced signal terminal and a second balanced signal terminal. The acoustic wave duplexer further includes a first interconnection arranged to connect the balanced filter unit and the first balanced terminal and a second interconnection arranged to connect the balanced filter unit and the second balanced terminal. The first and second interconnections intersect with each other while being insulated from each other.

16 Claims, 12 Drawing Sheets

ACOUSTIC WAVE DUPLEXER

BACKGROUND OF THE INVENTION

1. Field of the Invention

The present invention relates to a duplexer in which a transmission filter chip and a reception filter chip are mounted on a substrate and, more specifically, to an acoustic wave duplexer in which each filter chip is an acoustic wave filter chip, such as a surface acoustic wave filter chip or a boundary acoustic wave filter chip.

2. Description of the Related Art

Traditionally, for a mobile communication system, such as a cellular phone, in order to reduce the number of components, a composite component having multiple functions is highly desired. As one such example of a composite component, a duplexer is known to include a reception filter chip used in a reception circuit and a transmission filter chip used in a transmission circuit.

For example, Japanese Unexamined Patent Application Publication No. 2003-249842 discloses, as one example of duplexers of this type, a surface acoustic wave duplexer illustrated in the diagrammatic circuit diagram in FIG. 17, described in more detail below.

In a surface acoustic wave duplexer 1001, a transmission acoustic wave filter chip 1003 and a reception acoustic wave filter chip 1004 are surface mounted on a substrate 1002. Each of the transmission acoustic wave filter chip 1003 and the reception acoustic wave filter chip 1004 has a first end connected to a common terminal 1005. The reception acoustic wave filter chip 1004 is connected to the common terminal 1005 through a phase shift circuit 1006. The common terminal 1005 is a terminal connected to an antenna or the like.

The transmission acoustic wave filter chip 1003 includes a plurality of series arm resonators S1 to S3 each made of a 1-port surface acoustic wave resonator and parallel arm resonators P1 and P2 each made of a 1-port surface acoustic wave resonator. The transmission acoustic wave filter chip 1003 has an end that is opposite to the first end connected to the common terminal 1005 and that is connected to a transmission terminal 1007. An electric signal to be transmitted is input from the transmission terminal 1007 and supplied to the common terminal 1005 through the transmission acoustic wave filter chip 1003.

Meanwhile, the reception acoustic wave filter chip 1004 has a structure in which first and second longitudinally coupled resonator surface acoustic wave filters 1008 and 1009 are connected in parallel. Each of the longitudinally coupled resonator surface acoustic wave filters 1008 and 1009 includes a first IDT arranged in its center. First ends of the first IDTs are commonly connected to the common terminal 1005 through the phase shift circuit. A second end of each of the first IDTs is connected to a ground potential.

First ends of second and third IDTs arranged at both sides of the first IDT of the longitudinally coupled resonator surface acoustic wave filter 1008 in a surface wave propagation direction are commonly connected to a first reception terminal 1010.

First ends of second and third IDTs of the longitudinally coupled resonator surface acoustic wave filter 1009 are also commonly connected to the first reception terminal 1010. The second and third IDTs of each of the longitudinally coupled resonator surface acoustic wave filters 1008 and 1009 are commonly connected to a second reception terminal 1011 serving as a second balanced terminal.

Accordingly, the above-described reception acoustic wave filter chip 1004 is a surface acoustic wave filter including the first and second reception terminals 1010 and 1011 and having the balanced-to-unbalanced conversion function.

For the surface acoustic wave duplexer 1001 described in Japanese Unexamined Patent Application Publication No. 2003-249832, the transmission acoustic wave filter chip 1003 forming the transmission filter and the reception acoustic wave filter chip 1004 forming the reception filter are surface mounted on the substrate 1002 to aim at providing a multifunction device. Accordingly, the number of components can be reduced. In addition, the reception acoustic wave filter chip 1004 has the balanced-to-unbalanced conversion function, as described above, so a balun can be omitted.

However, there is a problem in which isolation between the transmission acoustic wave filter chip 1003 and the reception acoustic wave filter chip 1004 is not sufficient. That is, the transmission acoustic wave filter chip 1003 has a ladder circuit configuration, and during transmission, a transmission current flows and a magnetic field occurs. For the balanced reception acoustic wave filter chip 1004, a reception current is conveyed from the first reception terminal 1010 being the first balanced terminal toward the second reception terminal 1011 serving as the second balanced terminal. However, in a transmission frequency band, an induced current caused by the above-described magnetic field flows while being superimposed on the reception current. Because of this, a problem is present in which the isolation characteristic in the reception acoustic wave filter chip 1004 deteriorates in the pass band of the transmission band-pass filter.

SUMMARY OF THE INVENTION

In order to overcome the above-described drawbacks in the related art, preferred embodiments of the present invention provide an acoustic wave duplexer having a configuration in which at least one of a transmission acoustic wave filter chip and a reception acoustic wave filter chip is a balanced filter chip and having a satisfactory isolation characteristic between a reception acoustic wave filter chip and a transmission acoustic wave filter chip.

According to a preferred embodiment of the present invention, an acoustic wave duplexer includes a substrate, a reception acoustic wave filter chip, and a transmission acoustic wave filter chip, the reception and transmission acoustic wave filters being mounted on the substrate. The substrate includes first and second balanced terminals, a common terminal, and a signal terminal. Each of the transmission acoustic wave filter chip and the reception acoustic wave filter chip includes at least one acoustic wave excitation electrode, and at least one of the transmission acoustic wave filter chip and the reception acoustic wave filter chip is a balanced filter unit that includes, as an input terminal or an output terminal, a first balanced signal terminal and a second balanced signal terminal. The acoustic wave duplexer further includes a first interconnection arranged to connect the balanced filter unit and the first balanced terminal and a second interconnection arranged to connect the balanced filter unit and the second balanced terminal. The first balanced signal end of the balanced filter unit is a junction of the balanced filter unit and the first interconnection, and the second balanced signal end thereof is a junction of the balanced filter unit and the second interconnection. The first and second interconnections intersect with each other while being insulated from each other.

For the acoustic wave duplexer according to a preferred embodiment of the present invention, preferably, the substrate may be provided with a portion where the first and second interconnections intersect with each other. In this case, the portion where the first and second interconnections intersect with each other while being insulated from each other can be easily formed. In this case, more preferably, the substrate may be a laminated substrate in which a plurality of insulating layers are laminated, and the substrate may further include a plurality of conductive patterns spaced by a corresponding insulating layer of the laminated substrate disposed therebetween and a via hole conductor disposed so as to electrically connect at least two of the plurality of conductive patterns spaced by the corresponding insulating layer of the laminated substrate disposed therebetween. In this case, because the plurality of conductive patterns spaced by the corresponding insulating layer are provided on the laminated substrate and at least two of the plurality of conductive patterns obtained through the insulating layers are electrically connected to each other using the via hole, the structure in which the first and second interconnections intersect with each other while being insulated from each other can be easily formed by formation of at least one interconnection using one of the above-described conductive patterns.

For the acoustic wave duplexer according to a preferred embodiment of the present invention, the portion where the first and second interconnections intersect with each other may be provided on the balanced filter chip. In this case, it is not necessary to provide the structure in which the first and second interconnections intersect with each other while being insulated from each other to the substrate, the substrate can have a reduced size.

For the acoustic wave duplexer according to a preferred embodiment of the present invention, preferably, each of the reception acoustic wave filter chip and the transmission acoustic wave filter chip may be a balanced filter unit. In this case, because the reception acoustic wave filter chip is of the balanced type, the necessity of connecting the reception acoustic wave filter chip with a balun can be eliminated. Thus, the acoustic wave duplexer can have a reduced size.

For the acoustic wave duplexer according to a preferred embodiment of the present invention, the above-described balanced filter unit can be formed according to various methods to have various structures and arrangements. Preferably, the balanced filter unit may include a piezoelectric substrate and first and second longitudinally coupled resonator acoustic wave filters provided on the piezoelectric substrate. Each of the first and second longitudinally coupled resonator acoustic wave filters may include, as the acoustic wave excitation electrode, a first IDT and second and third IDTs arranged at both sides of the first IDT in an acoustic wave propagation direction and may further include a pair of reflectors arranged at both sides of a region in which the first to third IDTs are disposed in the acoustic wave propagation direction. The second IDTs of the first and second longitudinally coupled resonator acoustic wave filters may be connected to each other. The third IDTs of the first and second longitudinally coupled resonator acoustic wave filters may be connected to each other. A first bus bar of the first IDT of the second longitudinally coupled resonator acoustic wave filter may be a first balanced signal input/output unit. A second bus bar of the first IDT of the second longitudinally coupled resonator acoustic wave filter may be a second balanced signal input/output unit. This preferable balanced filter unit is hereinafter abbreviated as a particular preferable balanced filter unit.

Preferably, the first balanced signal input/output unit may be connected to the first balanced signal end, and the second balanced signal input/output unit may be connected to the second balanced signal end.

With regard to a particular aspect of the acoustic wave duplexer according to a preferred embodiment of the present invention, the balanced filter unit may include two of the above-described particular preferable balanced filter units, the two balanced filter units being connected in parallel. The first balanced signal input/output units of both of the two balanced filter units may be connected to the first balanced signal end. The second balanced signal input/output units of both of the two balanced filter units may be connected to the second balanced signal end.

With regarding to another particular aspect of the acoustic wave duplexer according to a preferred embodiment of the present invention, the balanced filter unit may include two of the above-described particular balanced filter units provided on the piezoelectric substrate, the two balanced filter units being connected in parallel. The first balanced signal input/output units of both of the two balanced filter units may be connected to the first balanced signal end. The second balanced signal input/output unit of either one of the two balanced filter units may be connected to the second balanced signal end.

With regard to still another particular aspect of the acoustic wave duplexer according to a preferred embodiment of the present invention, the balanced filter unit may include two of the above-described particular balanced filter units provided on the piezoelectric substrate, the two balanced filter units being connected in parallel. The first balanced signal input/output unit of either one of the two balanced filter units may be connected to the first balanced signal end. The second balanced signal input/output units of both of the two balanced filter units may be connected to the second balanced signal end.

The acoustic wave duplexer according to a preferred embodiment of the present invention may also have a structure in which the balanced filter unit including a piezoelectric substrate and first and second longitudinally coupled resonator acoustic wave filters provided on the piezoelectric substrate, each of the first and second longitudinally coupled resonator acoustic wave filters including, as the acoustic wave excitation electrode, a first IDT and second and third IDTs arranged at both sides of the first IDT in an acoustic wave propagation direction and further including a pair of reflectors arranged at both sides of a region in which the first to third IDTs are disposed in the acoustic wave propagation direction, the first balanced signal end being a portion of the first IDT or the second and third IDTs of the first longitudinally coupled resonator acoustic wave filter, the portion being connected to the first interconnection, the second balanced signal end being a portion of the first IDT or the second and third IDTs of the second longitudinally coupled resonator acoustic wave filter, the portion being connected to the second interconnection, a phase of an output signal to an input signal in the second longitudinally coupled resonator acoustic wave filter differing by 180° from a phase of an output signal to an input signal in the first longitudinally coupled resonator acoustic wave filter.

The acoustic wave duplexer according to a preferred embodiment of the present invention may also have a structure in which the balanced filter unit includes a piezoelectric substrate and first to fourth longitudinally coupled resonator acoustic wave filters provided on the piezoelectric substrate, each of the first to fourth longitudinally coupled resonator acoustic wave filters includes, as the acoustic wave excitation electrode, a first IDT and second and third IDTs arranged at both sides of the first IDT in an acoustic wave propagation direction, each of the first to fourth longitudinally coupled resonator acoustic wave filters further includes a pair of reflectors arranged at both sides of a region in which the first to third IDTs are disposed in the acoustic wave propagation direction, the first and third longitudinally coupled resonator acoustic wave filters are cascade-connected, the second and fourth longitudinally coupled resonator acoustic wave filters are cascade-connected, the first balanced signal end is a portion of the first IDT or the second and third IDTs of the third longitudinally coupled resonator acoustic wave filter, the portion being connected to the first interconnection, the second balanced signal end is a portion of the first IDT or the second and third IDTs of the fourth longitudinally coupled resonator acoustic wave filter, the portion being connected to the second interconnection, phases of an output signal to an input signal in three filters of the first to fourth longitudinally coupled resonator acoustic wave filters are the same, and the phases differs by 180° from a phase of an output signal to an input signal in the remaining one filter.

For the acoustic wave duplexer according to a preferred embodiment of the present invention, the transmission band-pass filter may be made of a ladder acoustic wave filter. In this case, a small insertion loss can be achieved.

For the acoustic wave duplexer according to a preferred embodiment of the present invention, as the acoustic wave, a surface acoustic wave may be used, and thus a surface acoustic wave filter device may be configured. Alternatively, a boundary acoustic wave may be used, and thus a boundary acoustic wave device chip may be configured.

For the acoustic wave duplexer according to a preferred embodiment of the present invention, preferably, the balanced filter unit may contain a piezoelectric resonator that includes a substrate, a piezoelectric film supported by the substrate and acoustically isolated from the substrate, and an upper electrode film and a lower electrode film as the excitation electrode. The upper electrode film and the lower electrode film are disposed such that the piezoelectric film is arranged therebetween.

For the acoustic wave duplexer according to a preferred embodiment of the present invention, the transmission acoustic wave filter chip and the reception acoustic wave filter chip are mounted on the substrate, at least one of the transmission acoustic wave filter chip and the reception acoustic wave filter chip is the balanced filter unit, and the first interconnection connecting the balanced filter unit and the first balanced terminal and the second interconnection connecting the balanced filter unit and the second balanced terminal intersect with each other while being insulated from each other. Thus, the isolation characteristic in the pass band of a transmission band-pass filter in the reception acoustic wave filter chip is improved, and the isolation characteristic in the pass band of a reception band-pass filter in the transmission acoustic wave filter chip is improved.

Accordingly, for a duplexer in which a reception acoustic wave filter chip and a transmission acoustic wave filter chip are surface-mounted on a substrate and at least one of the filter chips is a balanced filter unit, the duplexer has a significantly reduced size, and the isolation characteristic between the transmission acoustic wave filter chip and the reception acoustic wave filter chip are effectively improved.

Accordingly, the size of a mobile communication device, such as a cellular phone, is significantly reduced, and the isolation between transmission and reception sides is also enhanced. Accordingly, communication performance in transmission and reception is enhanced.

Other features, elements, steps, characteristics and advantages of the present invention will become more apparent from the following detailed description of preferred embodiments of the present invention with reference to the attached drawings.

DETAILED DESCRIPTION OF THE PREFERRED EMBODIMENTS

The present invention is explained below by the description of specific preferred embodiments of the present invention with reference to the drawings.

Figure 1:
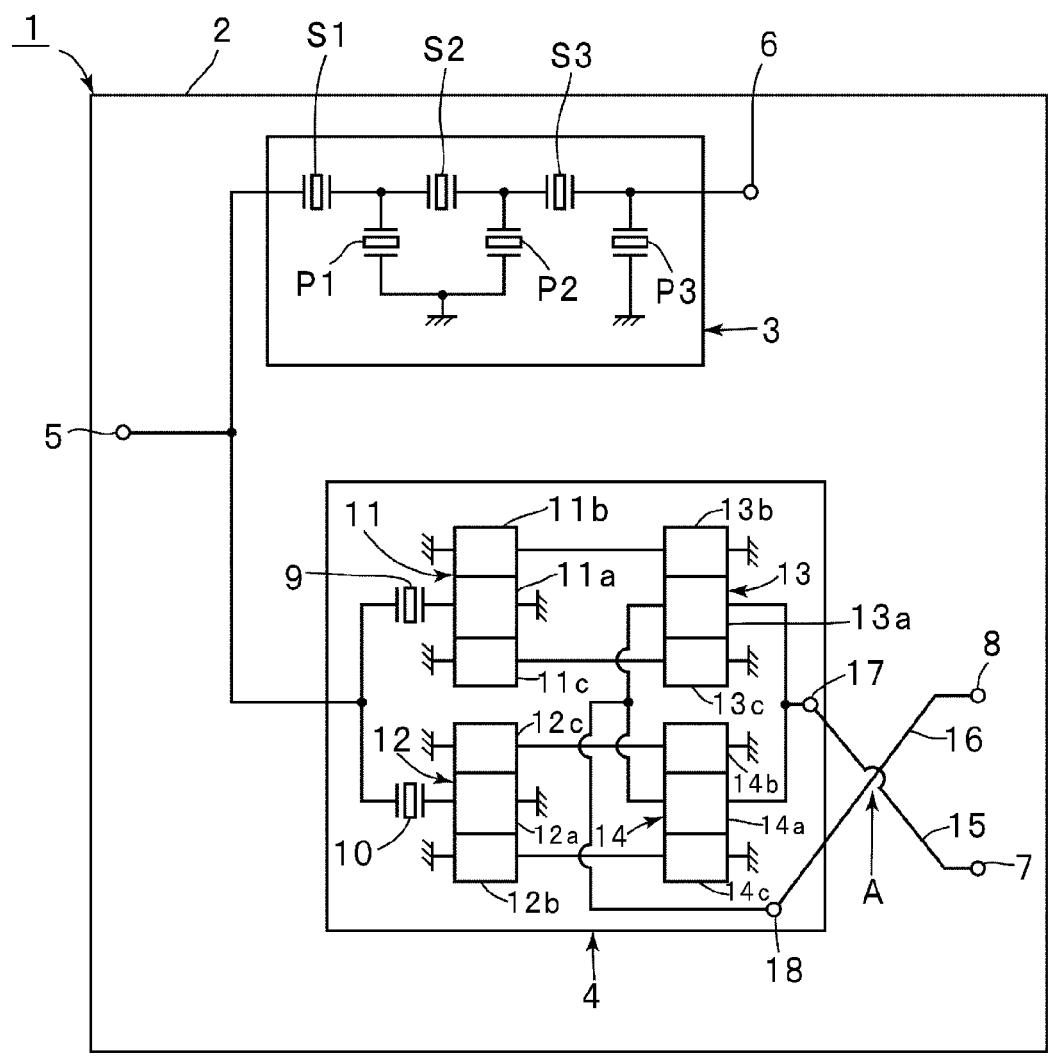
FIG. 1 is a diagrammatic circuit diagram that illustrates a circuit configuration of a duplexer according to a first preferred embodiment of the present invention.
Figure 2:
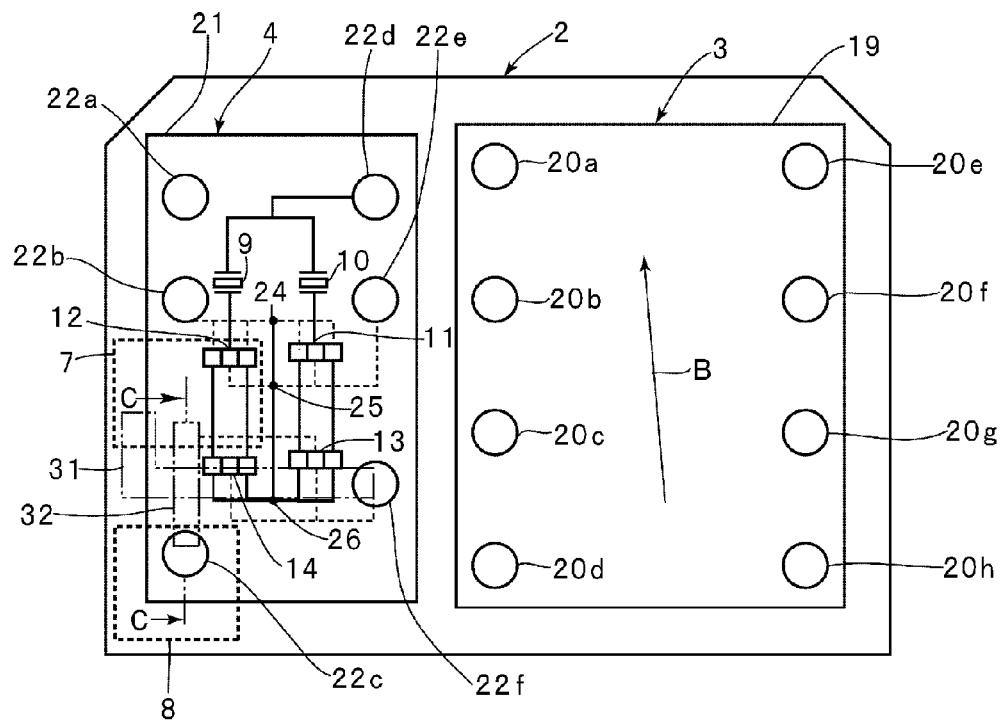
FIG. 2 is a plan view that schematically illustrates a duplexer according to a preferred embodiment of the present invention.
Figure 3:
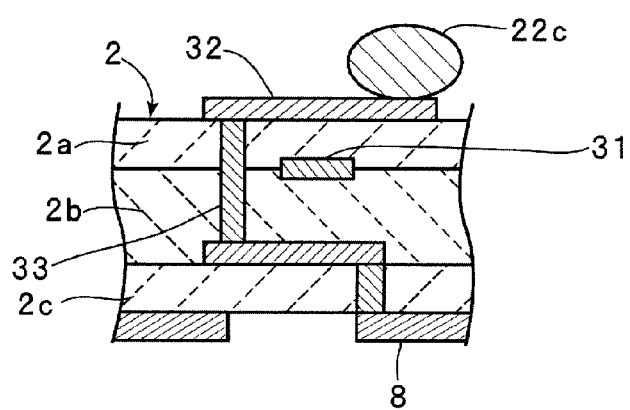
FIG. 3 is a partially cut-away enlarged side view that illustrates a portion extending along the line C-C in the duplexer of FIG. 2.

FIG. 1 is a schematic circuit diagram that illustrates a circuit configuration of a duplexer according to a preferred embodiment of the present invention. FIG. 2 is a schematic plan view that illustrates a structure of the duplexer according to the present preferred embodiment, and FIG. 3 is a partially cut-away side cross-sectional view that illustrates a main portion thereof.

A duplexer 1 according to the present preferred embodiment includes a substrate 2. With the present preferred embodiment, the substrate 2 preferably includes a plurality of insulating layers and is also made of a laminated substrate having conductor patterns laminated with the insulating layers disposed therebetween. The structure of the laminated substrate is described later.

An insulating material forming each of the insulating layers is not limited to a particular one, and as the material, proper insulation ceramic, for example, alumina, and synthetic resin can be used.

A transmission surface acoustic wave filter chip 3 and a reception surface acoustic wave filter chip 4, each of which has a circuit configuration illustrated in FIG. 1, are mounted on the substrate 2. The substrate 2 is provided with a common terminal 5 to connect to an antenna. The common terminal 5 is connected to the transmission acoustic wave filter chip 3. The transmission acoustic wave filter chip 3 is a surface acoustic wave filter having a ladder circuit configuration that has three series arm resonators S1-S3 and three parallel arm resonators P1-P3.

Each of the series arm resonators S1-S3 and the parallel arm resonators P1-P3 is made of a 1-port surface acoustic wave resonator.

The transmission acoustic wave filter chip 3 is electrically connected to a transmission terminal 6. A transmission signal is input from the transmission terminal 6 and output to the common terminal 5, which is connected to the antenna, through the transmission acoustic wave filter chip 3.

The duplexer 1 according to a preferred embodiment of the present preferred embodiment is preferably used as a duplexer of a cellular phone of PCS system, for example. The transmission frequency band is between about 1850 MHz and about 1910 MHz, and the reception frequency band is between about 1930 MHz and about 1990 MHz, for example.

The reception acoustic wave filter chip 4 has a first end connected to the common terminal 5 and a second end electrically connected to first and second balanced terminals 7 and 8 serving as first and second reception terminals, respectively.

The reception acoustic wave filter chip 4 has a circuit configuration illustrated in FIG. 1. That is, first and second longitudinally coupled resonator surface acoustic wave filters 11 and 12 are connected to the common terminal 5 through 1-port surface acoustic wave resonators 9 and 10, respectively. Although being schematically illustrated in FIG. 1, each of the longitudinally coupled resonator surface acoustic wave filters 11 and 12 is a 3-IDT longitudinally coupled resonator surface acoustic wave filter. That is, the first longitudinally coupled resonator surface acoustic wave filter 11 includes a first IDT 11a arranged in the center and second and third IDTs 11b and 11c arranged at both sides of the first IDT 11a in a surface wave propagation direction. Similarly, the longitudinally coupled resonator surface acoustic wave filter 12 includes first to third IDTs 12a-12c. A first end of the first IDT 11a and that of the first IDT 12a in the first and second longitudinally coupled resonator surface acoustic wave filters are commonly connected to the common terminal 5 through the 1-port surface acoustic wave resonators 9 and 10, respectively.

Each of the IDTs 11a and 12a has a second end connected to a ground potential.

Each of the second and third IDTs 11b and 11c of the first longitudinally coupled resonator surface acoustic wave filter 11 has a first end connected to a ground potential, and second ends thereof are connected to first ends of the second and third IDTs 13b and 13c, respectively, of a 3-IDT longitudinally coupled resonator surface acoustic wave filter 13. Each of the IDTs 13b and 13c has a second end connected to a ground potential.

Similarly, the downstream stage of the second longitudinally coupled resonator surface acoustic wave filter 12 is connected to a fourth 3-IDT longitudinally coupled resonator surface acoustic wave filter 14. That is, each of the IDTs 12b and 12c has a first end connected to a ground potential. Second ends of the IDTs 12b and 12c are electrically connected to first ends of IDTs 14b and 14c, respectively. Each of the IDTs 14b and 14c has a second electrode connected to a ground potential. A first end of a first IDT 14a and a first end of a first IDT 13a are commonly connected to the first balanced terminal 7, which serves as the first balanced signal terminal. Second ends of the first IDTs 14a and 13a are also commonly connected to the second balanced terminal 8, which serves as the second reception terminal.

Here, the first and second balanced terminals 7 and 8 are disposed adjacent to the substrate 2. The reception surface acoustic wave filter chip 4 is electrically connected to the first balanced terminal 7 by a first interconnection 15. Meanwhile, the reception surface acoustic wave filter chip 4 is connected to the second balanced terminal 8 by a second interconnection 16. Here, the junction of the first interconnection 15 and the reception surface acoustic wave filter chip 4 is a first balanced signal end 17, whereas the junction of the second interconnection 16 and the reception surface acoustic wave filter chip 4 is a second balanced signal end 18.

It is noted that each of the transmission surface acoustic wave filter chip 3 and the reception surface acoustic wave filter chip 4 is provided by formation of electrodes and interconnection patterns made of proper metal, such as aluminum, or alloy on a single side of a piezoelectric substrate to implement the above-described circuit configuration.

It is noted that, in the present preferred embodiment, the common terminal 5 and the first and second balanced terminals 7 and 8 are provided on the substrate 2. Meanwhile, as illustrated in FIG. 2, in the present preferred embodiment, the first and second interconnections 15 and 16 are disposed so as to reach onto the substrate 2, on which the reception surface acoustic wave filter chip 4 is disposed.

One of the unique characteristics of the present preferred embodiment is an intersection of the first interconnection 15 and the second interconnection 16 as indicated by the arrow "A" illustrated in FIG. 1. This makes it possible to improve an isolation characteristic of the transmission surface acoustic wave filter chip 3 and the reception surface acoustic wave filter chip 4 in their respective pass bands.

A specific structure illustrated in FIG. 1 is described with reference to FIGS. 2 and 3.

FIG. 2 illustrates, using a schematic plan view, the structure in which the transmission surface acoustic wave filter chip 3 and the reception surface acoustic wave filter chip 4 are mounted on the substrate 2. Here, the transmission surface acoustic wave filter chip 3 includes a piezoelectric substrate 19. An electrode structure and an interconnection pattern arranged to implement the circuit configuration of the transmission surface acoustic wave filter chip 3 illustrated in FIG. 1 are disposed on a lower surface of the piezoelectric substrate 19. Note that, in FIG. 2, for the sake of simplification of illustration, the piezoelectric substrate 19 is illustrated so as to be seen therethrough and the above-described electrode structure and interconnection patterns are omitted. A plurality of bumps 20a to 20h are disposed on the lower surface of the piezoelectric substrate 19 so as to be connected to the interconnection patter on the substrate 2. These bumps 20a to 20h are provided at the lower surface of the piezoelectric substrate 19 so as to project downward. The bumps 20a to 20h are electrically connected to corresponding electrodes connected to the common terminal 5, the ground terminals, and the transmission terminal 6 of the transmission surface acoustic wave filter chip 3. Here, it is preferred that the bump 20a is a bump connected to the common terminal 5; the bumps 20d to 20g are bumps connected to the ground terminals; and the bump 20h is a bump connected to the transmission terminal 6, which is illustrated in FIG. 1. The bumps 20b and 20c are electrically floating dummy bumps arranged to allow the transmission surface acoustic wave filter chip 3 to be stably mounted on the substrate 2. For the transmission surface acoustic wave filter chip 3, from the side of the bump 20h connected to the transmission terminal 6 toward the side of the bump 20a connected to the common terminal, a transmission current, for example, as indicated by the arrow B, flows. The transmission current produces a magnetic field.

Meanwhile, as illustrated in FIG. 2, also for the reception surface acoustic wave filter chip 4, a plurality of bumps 22a to 22f are disposed on a lower surface of a piezoelectric substrate 21. For the reception surface acoustic wave filter chip 4, an electrode structure, as schematically indicated by the solid lines in FIG. 1, is disposed on the lower surface of the piezoelectric substrate 21.

The bumps 22a to 22f also project downward from the lower surface of the piezoelectric substrate 21. The bumps 22a to 22f are electrically connected to corresponding electrodes connected to the common terminal 5, the ground terminals, and the first and second balanced terminals 7 and 8 of the reception surface acoustic wave filter chip 4.

Among the bumps 22a to 22f, the bump 22a is a floating bump, the bumps 22b and 22e are bumps connected to the ground terminals, and the bump 22c is a bump connected to the second balanced terminal. The bump 22d is a bump connected to the common terminal 5, and the bump 22f is a bump electrically connected to the first balanced terminal. These bumps 22b to 22f are electrically connected to the reception surface acoustic wave filter disposed on the piezoelectric substrate 21.

Among the interconnection patterns connecting the first to fourth longitudinally coupled resonator surface acoustic wave filters 11 to 14 disposed in the reception surface acoustic wave filter chip 4, an interconnection pattern indicated by the solid lines and an interconnection pattern indicated by the broken lines are disposed at different height positions within the piezoelectric substrate 21. The interconnection patterns disposed at different height positions are electrically connected to each other by via hole conductors 24, 25, and 26.

Meanwhile, in the present preferred embodiment, the first balanced terminal 7 and the first balanced signal end 17 are connected to each other by the first interconnection 15, and the second balanced terminal 8 and the second balanced signal end 18 are connected to each other by the second interconnection 16 (see FIG. 1). This is realized on the substrate 2 illustrated in FIG. 2 in the present preferred embodiment. That is, in FIG. 2, an interconnection pattern 31 indicated by the alternate long and short dashed lines defines the first interconnection 15, whereas an interconnection pattern 32 indicated by the alternate long and short dashed lines defines the second interconnection 16. As is clear from the partially cut-away side cross-sectional view illustrated in FIG. 3, which shows the portion taken along the line C-C of FIG. 2, the interconnection patterns 31 and 32 are disposed at different height positions in the substrate 2, and accordingly, they intersect with each other while being insulated from each other. More specifically, as illustrated in FIG. 3, the substrate 2 has a structure in which first and second insulating layers 2a and 2b are laminated. The interconnection pattern 32 defining the second interconnection to which the bump 22c disposed on the lower surface of the reception surface acoustic wave filter chip 4 is coupled is disposed on the substrate 2. The interconnection pattern 32 is electrically connected to the second balanced terminal 8 disposed on the lower surface of the substrate 2 through a via hole conductor 33.

Meanwhile, the interconnection pattern 31 defining the first interconnection 15 is disposed in the border between the insulating layers 2a and 2b. The interconnection pattern 31 has an L shape indicated by the alternate long and short dashed lines at the height position between the insulating layers 2a and 2b. The first balanced terminal 7 is disposed on the lower surface of the substrate 2. The first balanced terminal 7 and the interconnection pattern 31 are electrically connected to each other by a via hole electrode (not shown).

As described above, the interconnection patterns 31 and 32 defining the first and second interconnections 15 and 16, respectively, intersect with each other while being insulated from each other. This structure suppresses and minimizes the effects of a magnetic field produced by the above-described transmission current flowing in the direction indicated by the arrow B and thus improves the isolation characteristic between the surface acoustic wave filter chips 3 and 4.

Figure 4:
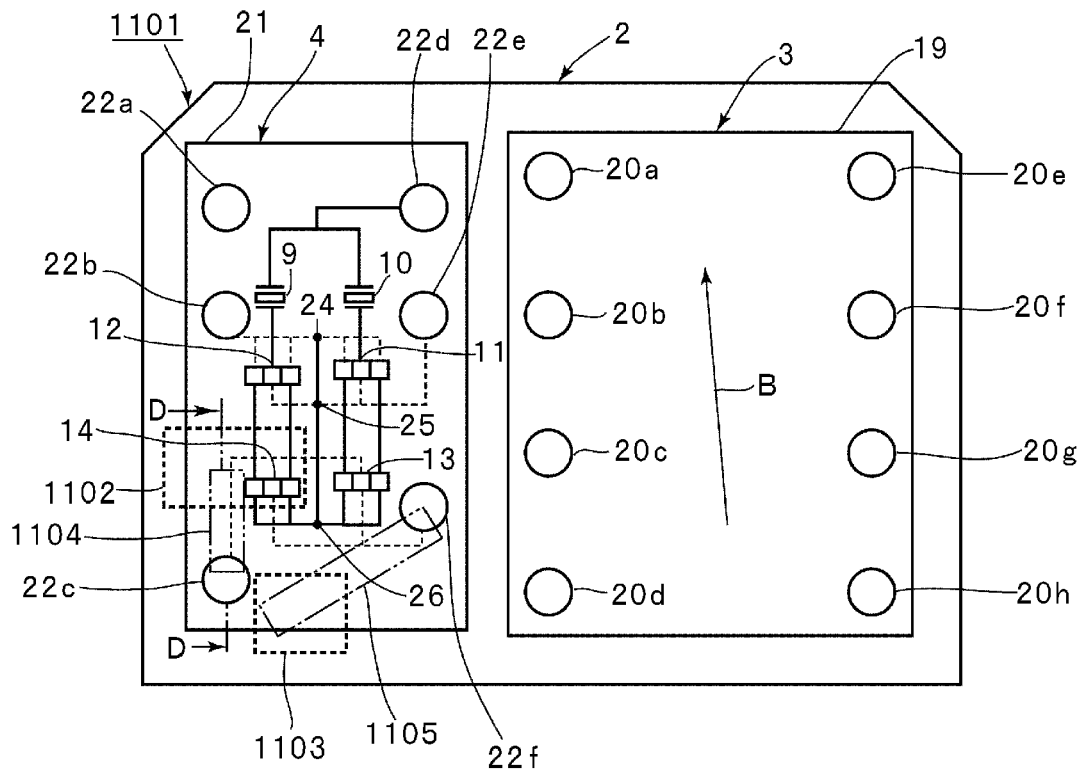
FIG. 4 is a schematic plan view of a traditional duplexer prepared for comparison.
Figure 5:
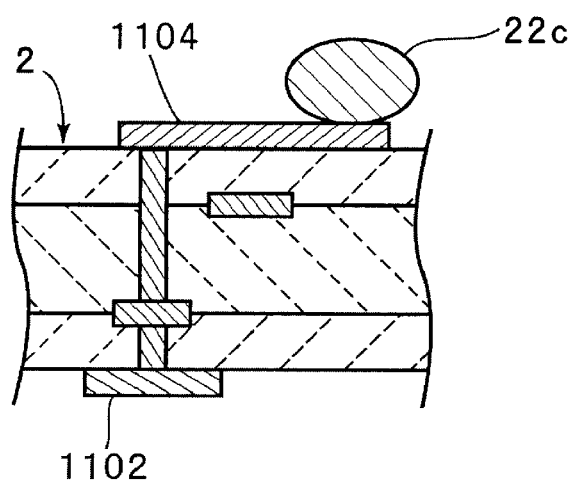
FIG. 5 is a partially cut-away enlarged side view that illustrates a portion extending along the line D-D in the duplexer prepared for comparison illustrated in FIG. 4.

This is described with reference to FIGS. 6 to 10. First, for comparison, a duplexer according to a traditional example is described with reference to schematic plan and cross-sectional views illustrated in FIGS. 4 and 5, FIG. 5 being a partially cut-away side cross-sectional view taken along the line D-D of FIG. 4. A duplexer 1101 of this comparative example includes a transmission surface acoustic wave filter chip and a reception surface acoustic wave filter chip that are substantially the same as those in the above-described preferred embodiment. The only difference is that the first and second interconnections connecting the first and second balanced signal ends of the reception surface acoustic wave filter chip with the first and second balanced terminals do not intersect with each other. More specifically, as illustrated in FIG. 4, an interconnection pattern 1104 defining the first interconnection connected to the first balanced signal end and a first balanced terminal 1102 and an interconnection pattern 1105 defining the second interconnection connected to the second balanced signal end and a second balanced terminal 1103 are isolated from each other so as not to intersect with each other, as illustrated. In other respects, the duplexer 1101 of the above-described comparative example preferably has a configuration similar to the duplexer 1 of the above-described preferred embodiment. Accordingly, the description of the common portions is omitted by use of the same reference numerals in the common portions.

Figure 6:
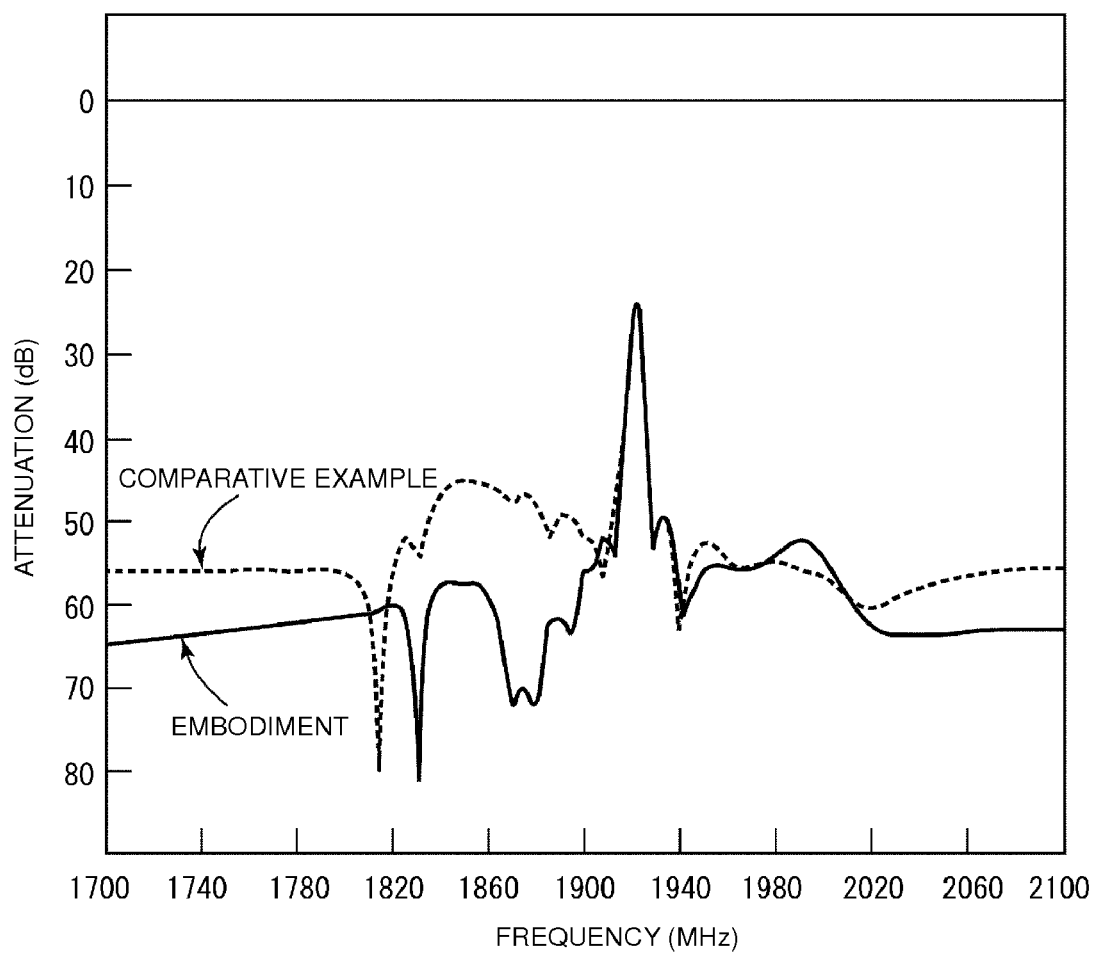
FIG. 6 is an illustration showing isolation characteristics of the duplexer according to a preferred embodiment of the present invention and the duplexer according to the comparative example.
Figure 7:
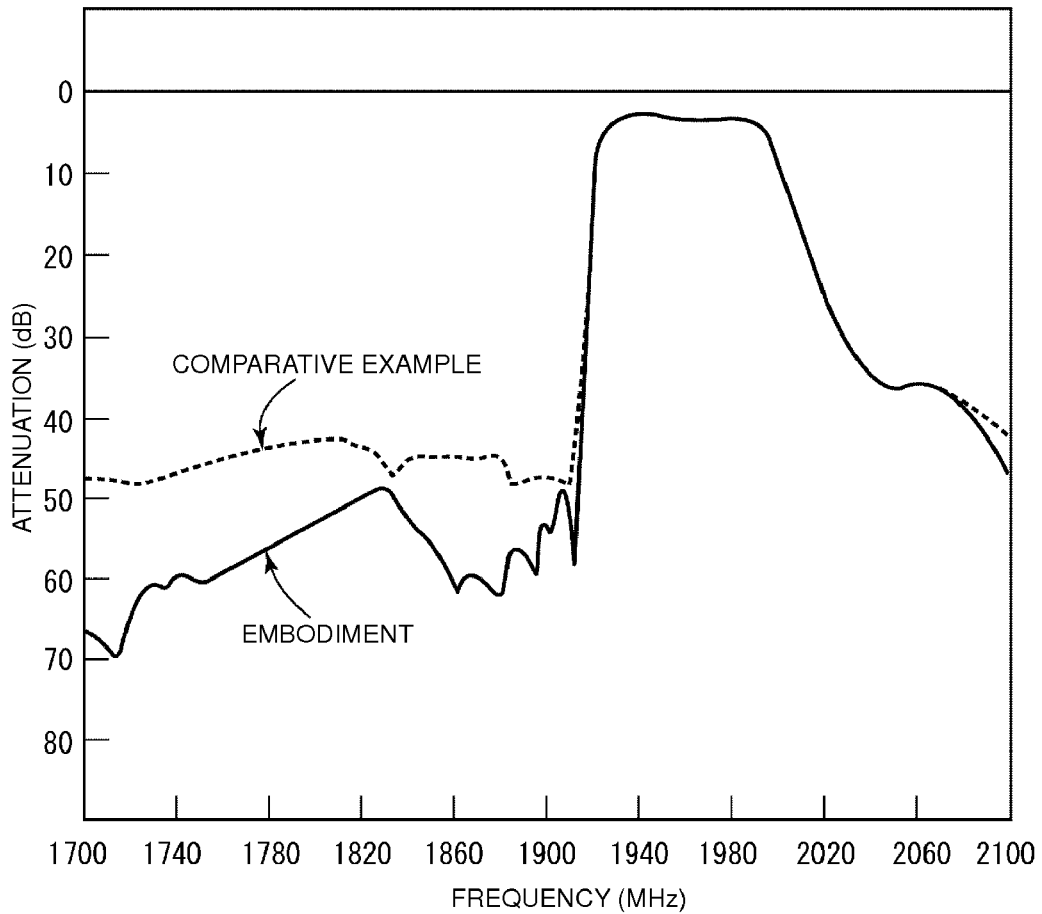
FIG. 7 is an illustration showing filter characteristics of the duplexer according to a preferred embodiment of the present invention and the duplexer according to the comparative example.

FIG. 6 shows isolation characteristics of duplexers of the above-described preferred embodiment and comparative example. FIG. 7 illustrates filter characteristics of reception surface acoustic wave filters. In FIGS. 6 and 7, the solid lines represent a result of the above-described preferred embodiment, whereas the broken lines represent a result of the above-described comparative example. The vertical axis of FIGS. 6 and 7 indicates an attenuation (dB). FIG. 6 shows the degree of leakage of signals from the transmission surface acoustic wave filter chip 3 toward the reception surface acoustic wave filter chip 4. As is clear from FIG. 6, according to the above-described preferred embodiment, in the range of about 1850 MHz to about 1910 MHz being the transmission band, large attenuation is obtainable in comparison with that according to the comparative example, and accordingly, the isolation characteristic can be effectively enhanced. Referring to FIG. 7, which shows filter characteristics of the reception surface acoustic wave filters, it is found that, according to the above-described preferred embodiment of the present invention, attenuation in the transmission pass-band can be sufficiently increased in comparison with that according to the comparative example.

That is, it is found that intersection of the first and second interconnections can sufficiently improve the isolation characteristic. This is because, in the reception surface acoustic wave filter chip 4, which is a balanced filter chip, the characteristic is improved by enhancement in balance.

That is, to obtain a large degree of isolation between the balance outputs, it is preferable that, when a signal is input into a transmission terminal, an output single in the first balanced terminal and that in the second balanced terminal have the same amplitude and the same phase. As the amplitudes and the phases of output signals in the first and second balanced terminals are nearer the same, the differential amplitude approaches 0, and larger attenuation is obtainable. Accordingly, the greater the degree of balance, the greater the characteristic, in comparison with that obtained when the outputs would be unbalanced.

Figure 8:
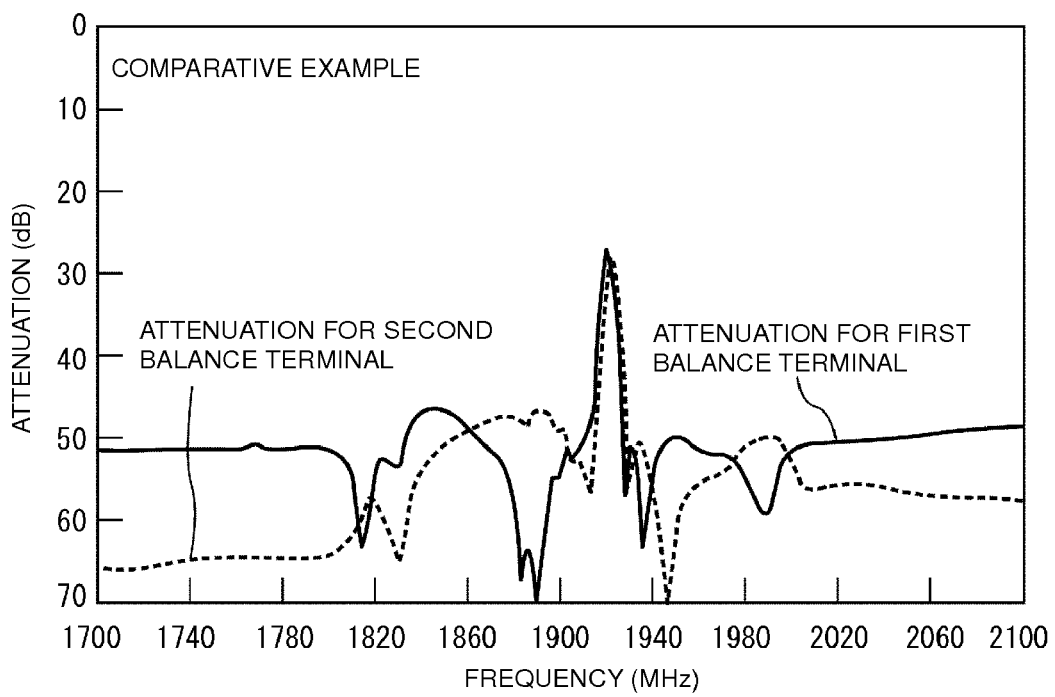
FIG. 8 is an illustration showing an amplitude characteristic in an isolation characteristic in the duplexer prepared for comparison.
Figure 9:
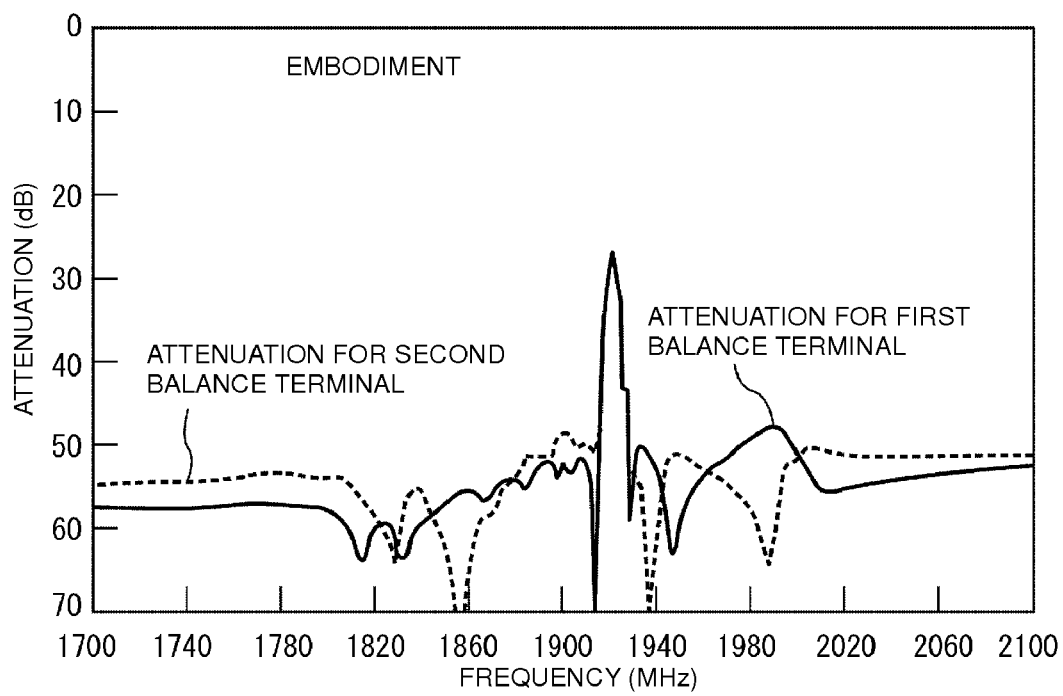
FIG. 9 is an illustration showing an amplitude characteristic in an isolation characteristic in the preferred embodiment of the present invention illustrated in FIG. 1.

FIGS. 8 and 9 show an amplitude characteristic in isolation in the comparative example and that in the present preferred embodiment of the present invention, respectively. In FIGS. 8 and 9, the solid lines indicate the amplitude characteristic between the common terminal and the first balanced terminal 7, whereas the broken lines indicates the amplitude characteristic between the common terminal and the second balanced terminal 8. In FIGS. 8 and 9, the horizontal axis indicates a frequency, whereas the vertical axis indicates an attenuation.

Figure 10:
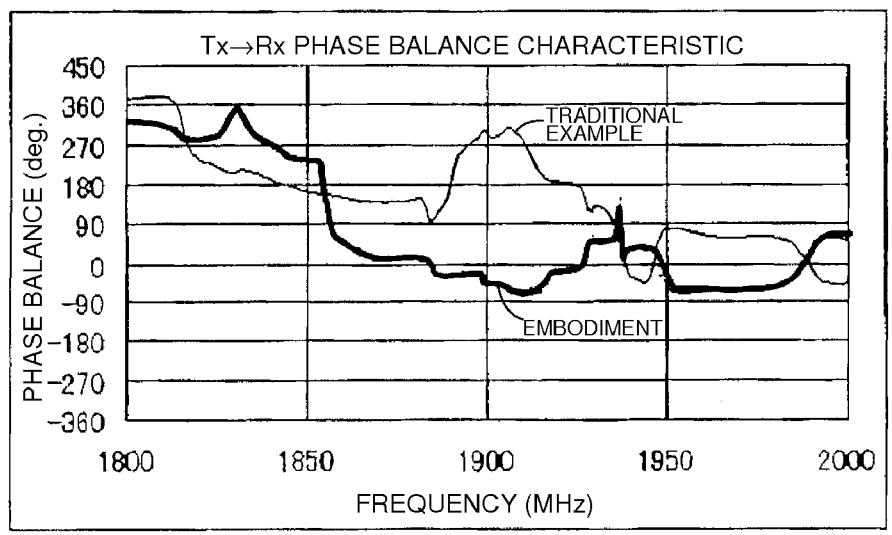
FIG. 10 is an illustration showing phase balance characteristics in the traditional example prepared for comparison and in a preferred embodiment of the present invention.

FIG. 10 shows a phase balance characteristic in isolation. That is, FIG. 10 shows a phase difference between a signal output to the first balanced terminal and a signal output to the second balanced terminal when a signal is input into a transmission terminal. In FIG. 10, the vertical axis indicates a phase difference, the thin line indicates a result of the comparative example, and the thick line indicates a result of the above-described preferred embodiment of the present invention.

From the comparison between FIGS. 8 and 9 and as is clear from FIG. 10, it is revealed that the balance of the amplitude characteristic and the balance of the phase characteristic are improved by intersection of the first and second interconnections. This is because, with reference to a magnetic field caused by passage of a transmission current, an electromagnetic induction current flowing into the first and second balanced terminals is reduced by intersection of the above-described first and second interconnections 15 and 16.

Accordingly, with the duplexer of the present preferred embodiment, the isolation in the transmission surface acoustic wave filter chip 3 and the reception surface acoustic wave filter chip 4 is effectively enhanced.

For the duplexer according to a preferred embodiment of the present invention, the circuit configuration in the reception surface acoustic wave filter chip 4 is not limited to one illustrated in FIG. 1. Circuit configurations of duplexers according to such modification examples in which balanced filter units have modified circuit configurations are illustrated in FIGS. 11 to 17 using diagrammatic plan views.

Figure 11:
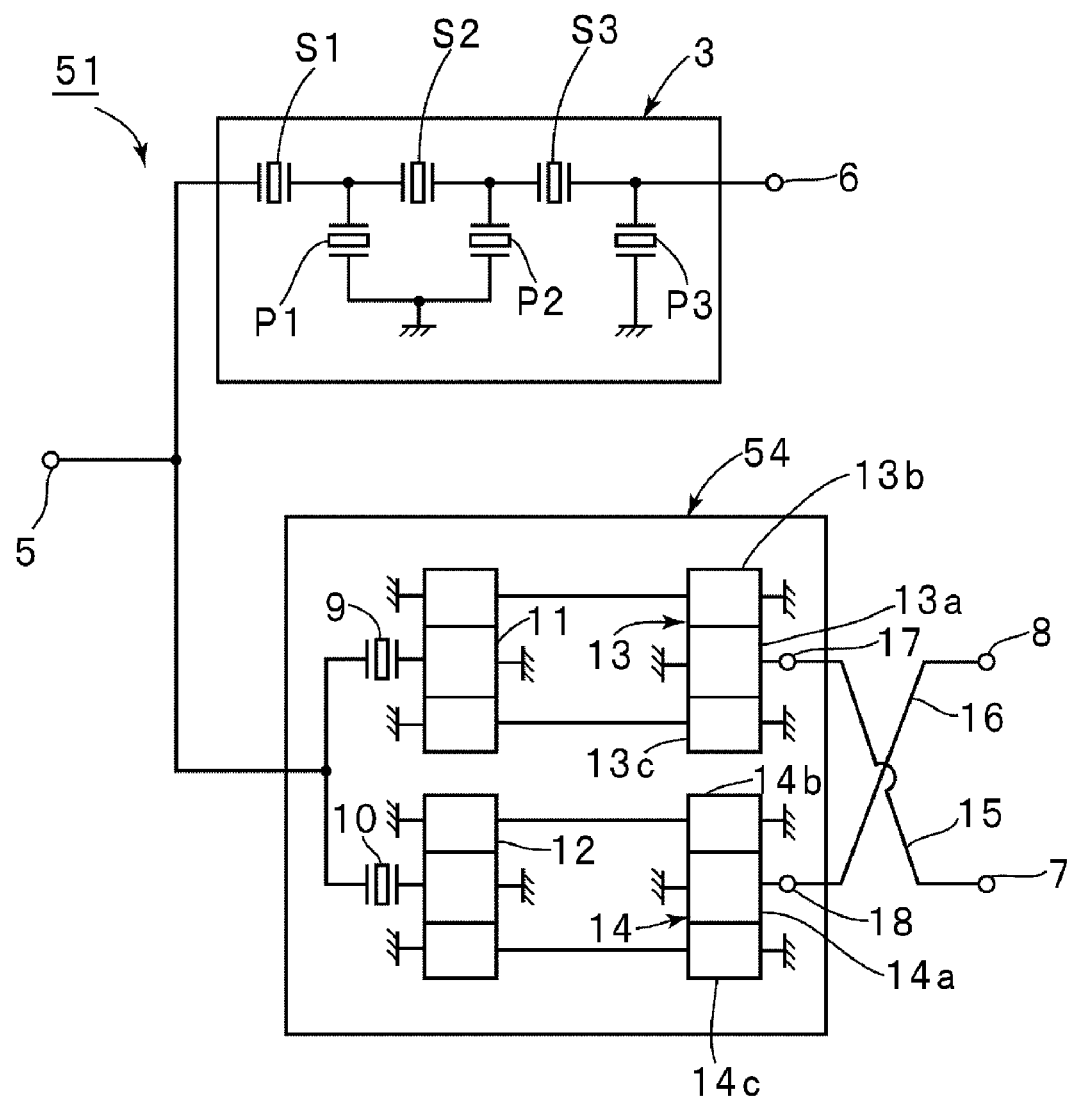
FIG. 11 is a schematic circuit diagram that illustrates a duplexer according to a modification example of a preferred embodiment of the present invention.

In a duplexer 51 illustrated in FIG. 11, a reception surface acoustic wave filter chip 54 is a balanced surface acoustic wave filter chip. In this case, similar to the first preferred embodiment, the first to fourth 3-IDT type longitudinally coupled resonator surface acoustic wave filters 11 to 14 are used. The first and second balanced signal ends 17 and 18 connected to the first and second balanced terminals 7 and 8 are connected to first ends of the first IDTs 13*a* and 14*a* of the third and fourth longitudinally coupled resonator surface acoustic wave filters, and the second ends of the first IDTs 13*a* and 14*a* are connected to ground potentials. In such a way, the reception surface acoustic wave filter chip 54 having a two-stage cascade-connected structure with a neutral point may also be used. Also in this case, the first and second interconnections 15 and 16 intersect with each other while being insulated from each other, as illustrated. Thus, similar to the first preferred embodiment, the isolation characteristic is improved by enhancement in balance.

Figure 12:
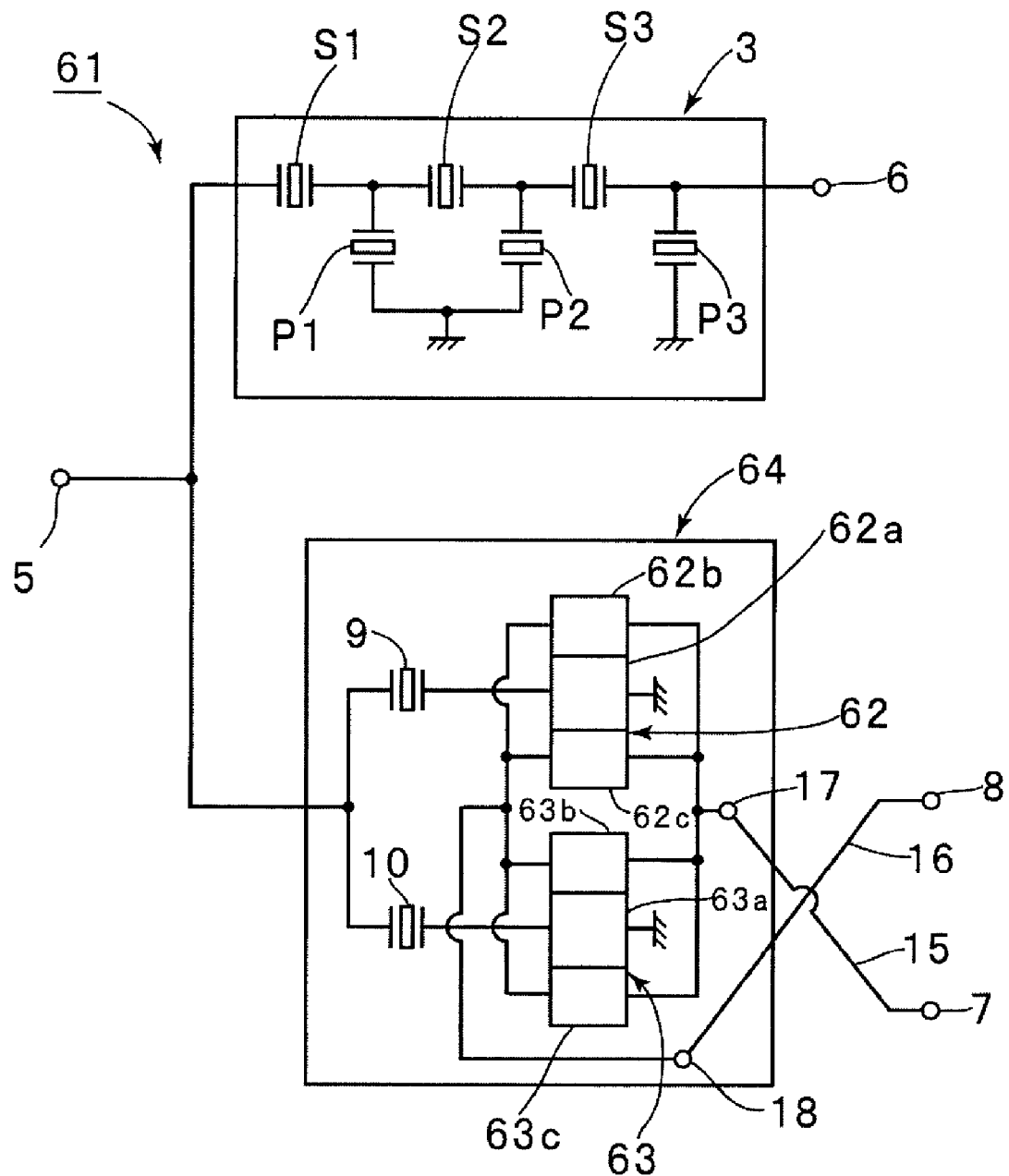
FIG. 12 is a schematic circuit diagram that illustrates a duplexer according to another modification example of a preferred embodiment of the present invention.

FIG. 12 is a schematic plan view that illustrates a duplexer according to another modification example of a preferred embodiment of the present invention. In a duplexer 61 according to the modification example illustrated in FIG. 12, similar to the reception surface acoustic wave filter chip 4 according to the first preferred embodiment, a reception surface acoustic wave filter chip 64 is made of a floating balanced surface acoustic wave filter chip. In this case, however, the reception surface acoustic wave filter chip 64 includes first and second 3-IDT type longitudinally coupled resonator surface acoustic wave filters 62 and 63. First ends of central first IDTs 62*a* and 63*a* of the first and second longitudinally coupled resonator surface acoustic wave filters 62 and 63 are connected to the common terminal 5 through the 1-port surface acoustic wave resonators 9 and 10, respectively. Second ends thereof are connected to ground potentials. First ends of second and third IDTs 62*b*, 62*c*, 63*b*, and 63*c* are commonly connected to the first balanced signal end 17, and second ends thereof are commonly connected to the second balanced signal end 18. The other configuration is substantially the same as that in the first preferred embodiment. Also in this case, for the reception surface acoustic wave filter chip 64, which is a balanced filter chip, the first and second interconnections 15 and 16 intersect with each other while being insulated from each other. Thus, similar to the first preferred embodiment, the isolation characteristic is improved by improvement in balance characteristic.

Figure 13:
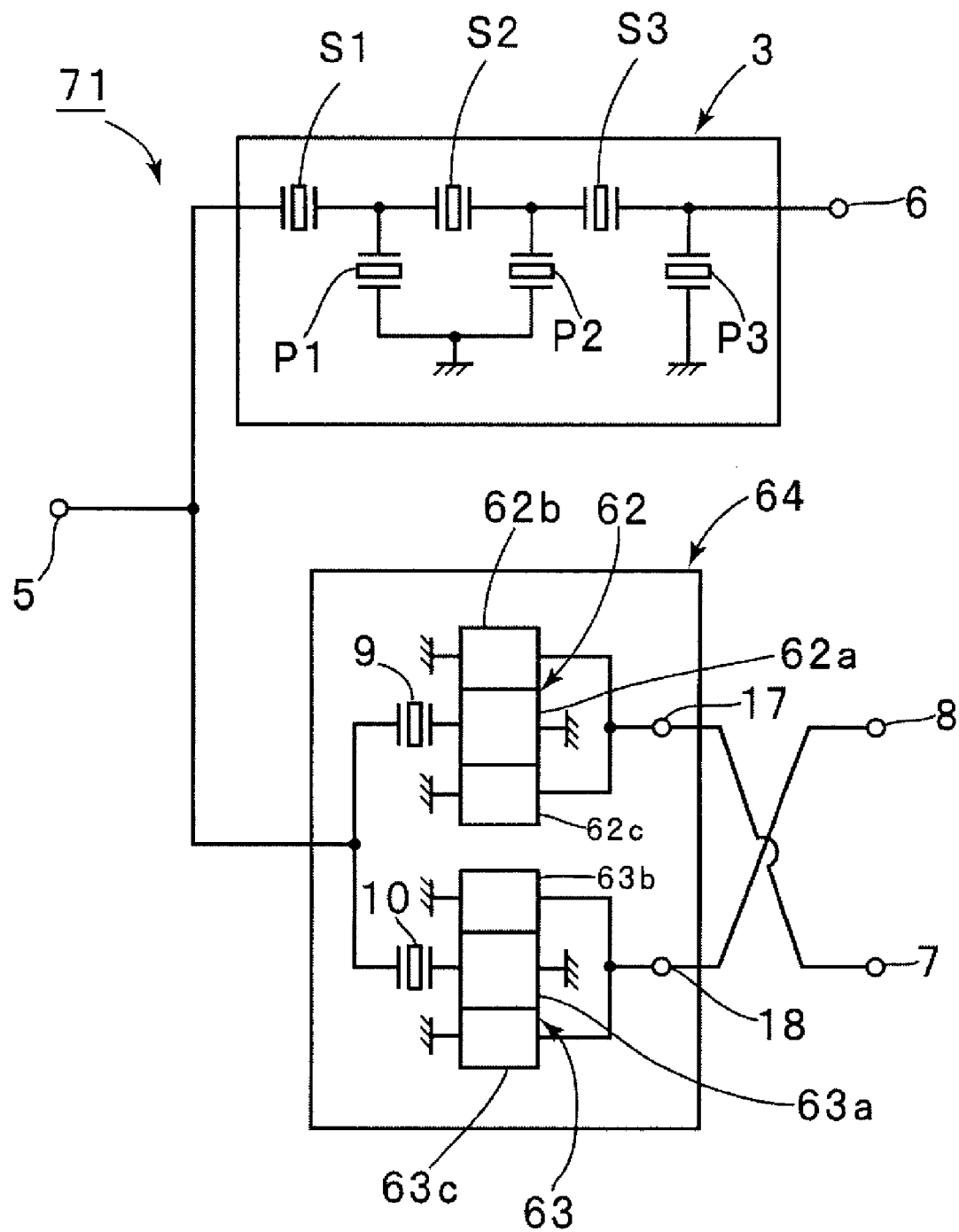
FIG. 13 is a schematic circuit diagram that illustrates a duplexer according to still another modification example of a preferred embodiment of the present invention.

FIG. 13 is a diagrammatic plan view that illustrates a circuit configuration of a duplexer according to still another modification example of the present invention. In a duplexer 71 illustrated in FIG. 13, similar to the modification example illustrated in FIG. 12, the first and second longitudinally coupled resonator surface acoustic wave filters 62 and 63 are connected to the common terminal 5 through the 1-port surface acoustic wave resonators 9 and 10, respectively. However, a single-stage structure with a neutral point is used, so the first ends of the second and third IDTs 62*b* and 62*c* are commonly connected to the first balanced signal end, and the first ends of second and third IDTs 63*b* and 63*c* are commonly connected to the second balanced signal end. The second ends of the IDTs 62*a* to 62*c* and 63*a* to 63*c* are connected to ground potentials. In such a way, a neutral-point type having the two longitudinally coupled resonator surface acoustic wave filters 62 and 63 may also be used. Also in this case, because the first and second interconnections 15 and 16 intersect with each other, the balance is enhanced, and this improves the isolation characteristic.

Figure 14:
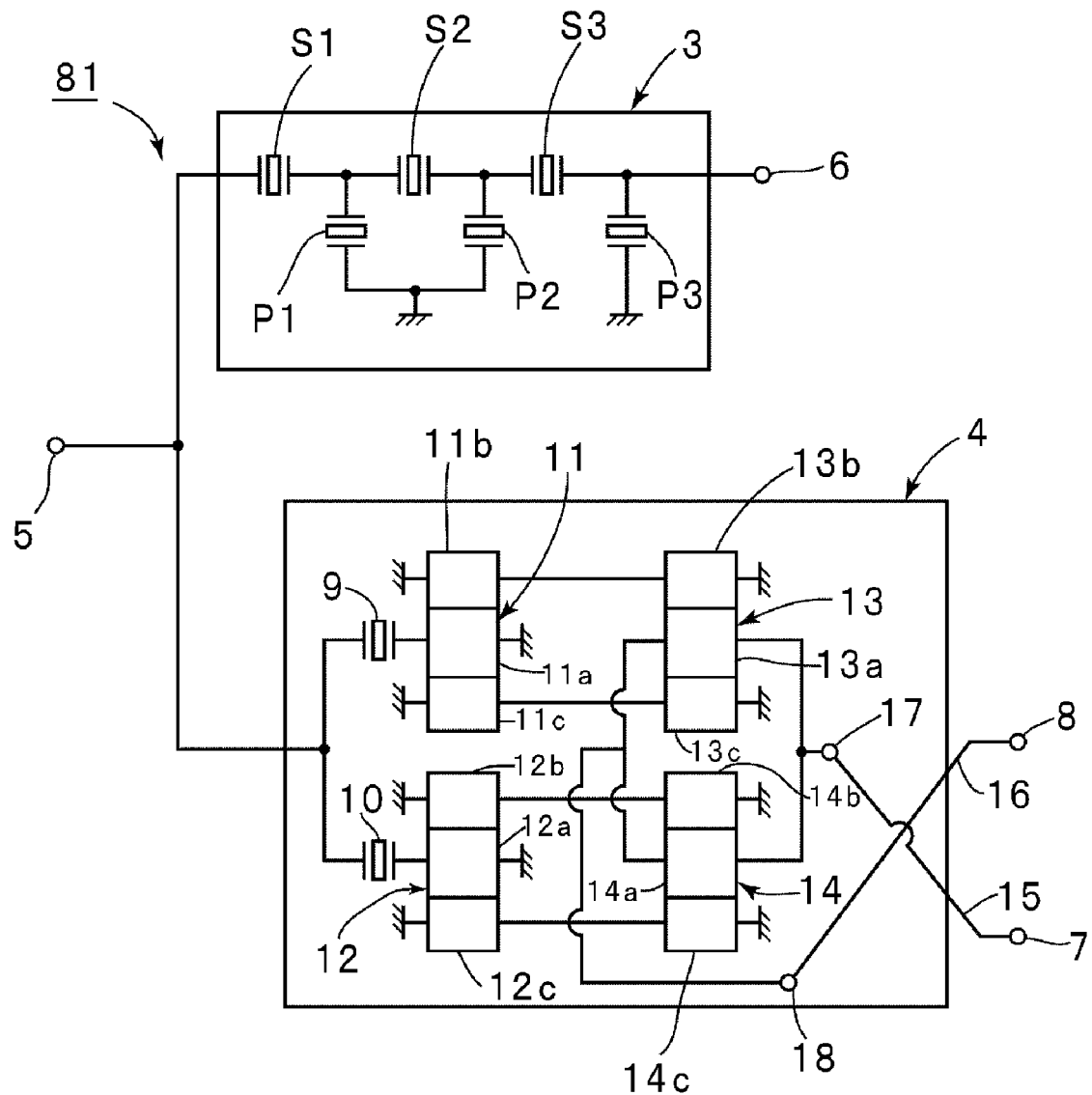
FIG. 14 is a schematic circuit diagram that illustrates a duplexer according to another modification example of a preferred embodiment of the present invention.

FIG. 14 is a schematic circuit diagram that illustrates a duplexer according to still another modification example of a preferred embodiment of the present invention. In a duplexer 81 illustrated in FIG. 14, the portion where the first and second interconnections 15 and 16 intersect with each other is disposed adjacent to the reception surface acoustic wave filter chip 4. The other respects are substantially the same as in the first preferred embodiment. In such a way, the portion where the first and second interconnections 15 and 16 intersect with each other may also be disposed within the reception surface acoustic wave filter chip 4, i.e., a balanced surface acoustic wave filter chip, not on the substrate 2.

Figure 15:
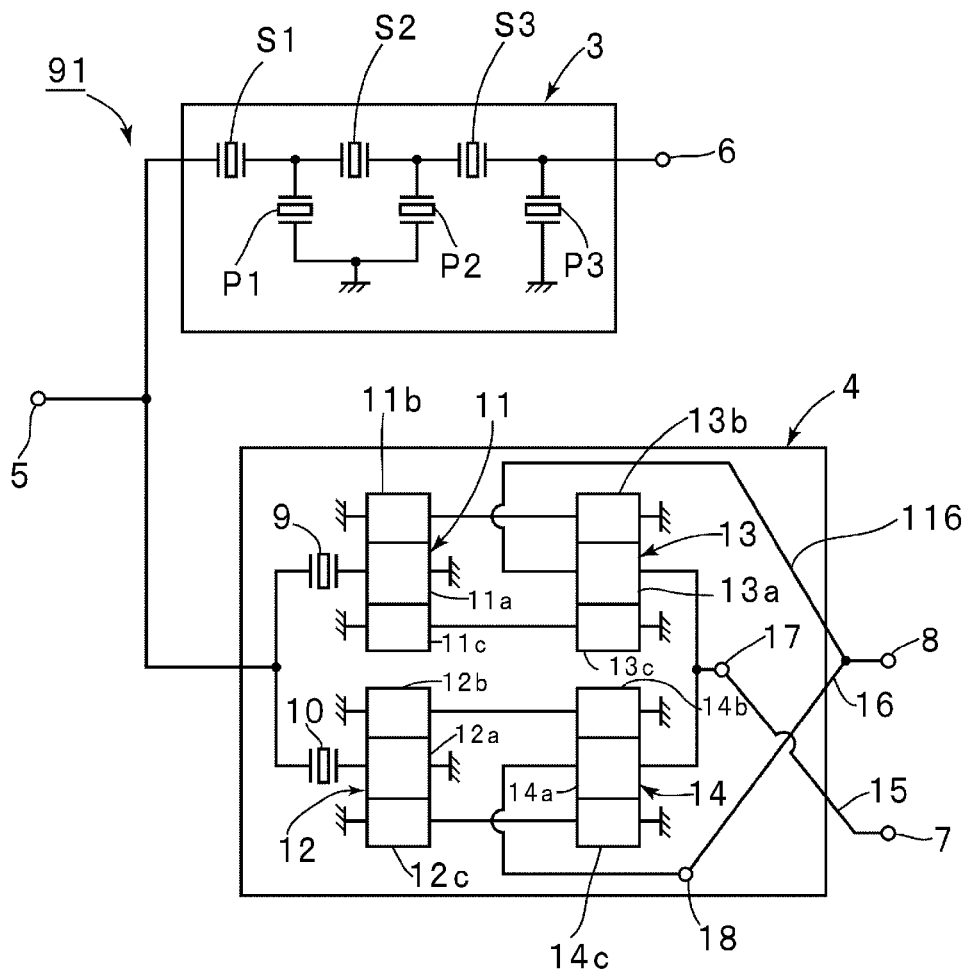
FIG. 15 is a schematic circuit diagram that illustrates a duplexer according to still another modification example of a preferred embodiment of the present invention.

FIG. 15 is a circuit diagram that illustrates still another modification example of a preferred embodiment of the present invention. In a duplexer 91 according to this modification example, similar to the case of the duplexer 81 according to the modification example illustrated in FIG. 14, the portion where the first and second interconnections 15 and 16 intersect with each other is disposed within the reception surface acoustic wave filter chip, which is a balanced filter chip.

In the duplexer 91 according to a preferred embodiment of the present modification example, a bus bar of each of the central IDTs 13a and 14a of the third and fourth longitudinally coupled resonator surface acoustic wave filters 13 and 14 are a balanced signal input/output unit. Unlike the duplexer 81 according to the modification example illustrated in FIG. 14, only a second bus bar (balanced signal input/output unit) of the central IDT 14a is connected to the second balanced signal end 18. A second bus bar (balanced signal input/output unit) of the central IDT 13a is connected to the second balanced terminal 8 through another interconnection 116. Similar to the case of the duplexer 81 according to the modification example illustrated in FIG. 14, the first bus bar (balanced signal input/output unit) of the central IDT 13a and the first bus bar (balanced signal input/output unit) of the central IDT 14a are both connected to the first balanced signal end 17. The first and second balanced signal ends 17 and 18 are connected to first ends of the first and second interconnections 15 and 16, respectively. In such a way, in the duplexer according to a preferred embodiment of the present invention, the portion where the first and second interconnections intersect with each other in the balanced filter chip may also be the portion where the first interconnection 15 connected to the two first bus bars and the second interconnection connected to one of the two second bus bars intersect with each other.

For the above-described first preferred embodiment and the modification examples, the transmission filter preferably has a ladder circuit configuration, but it is not limited to the one having the ladder circuit configuration. At least one of the transmission surface acoustic wave filter chip and the reception surface acoustic wave filter chip may be a balanced filter chip, so the reception surface acoustic wave filter chip does not necessarily have to be of the balanced type.

Furthermore, in place of the surface acoustic wave filter chips, boundary acoustic wave filter chips making use of a boundary acoustic wave may also be used.

Figure 16:
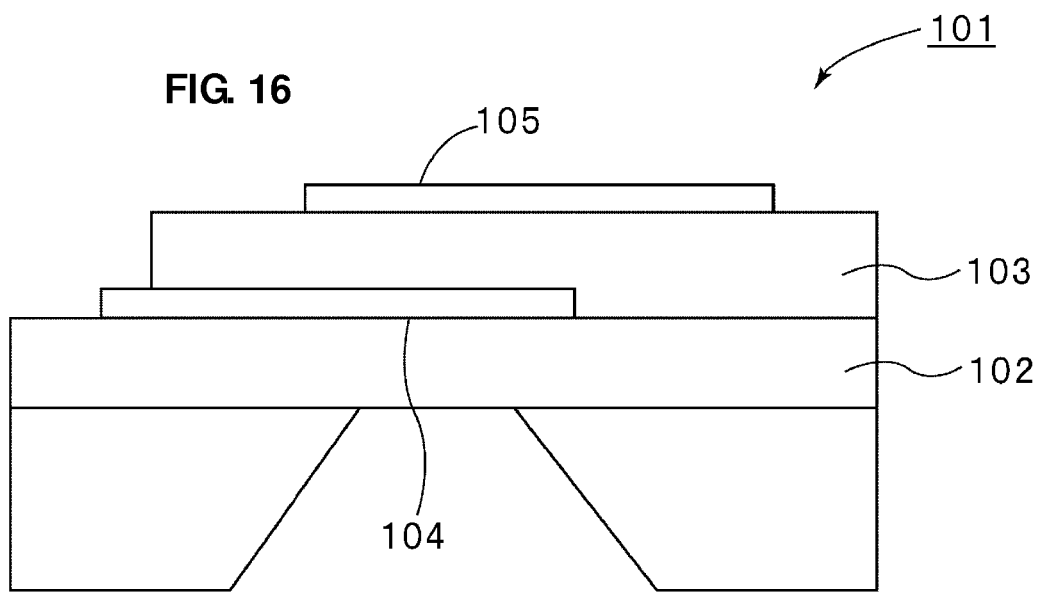
FIG. 16 is a schematic front view that illustrates an example of a piezoelectric resonator forming a balanced filter unit according to a preferred embodiment of the present invention.
Figure 17:
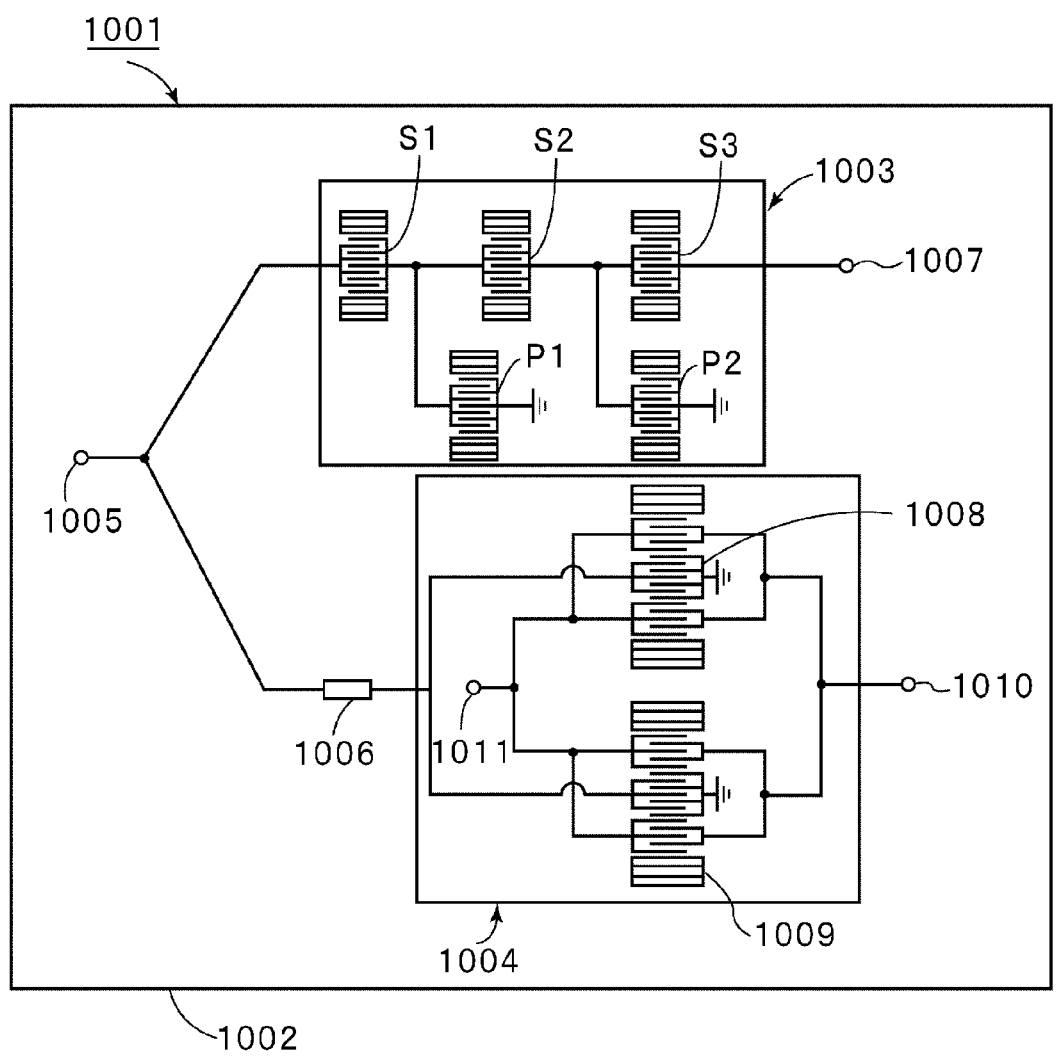
FIG. 17 is a schematic circuit diagram that illustrates a circuit configuration of a traditional duplexer.

In various preferred embodiments of the present invention, the above-described balanced filter unit may also be formed using a piezoelectric resonator illustrated in FIG. 16. A piezoelectric resonator 101 illustrated in FIG. 16 includes a substrate 102. The substrate 102 is preferably made of suitable insulation ceramic or synthetic resin, for example. A piezoelectric thin film 103 is disposed on the substrate 102. A lower electrode 104 and an upper electrode 105 are disposed so as to be opposed to each other such that the piezoelectric thin film 103 is disposed therebetween. Each of the lower electrode 104 and the upper electrode 105 defines an excitation electrode according to a preferred embodiment of the present invention and is preferably made of a suitable metal, such as silver or aluminum, or alloy. The piezoelectric thin film 103 is preferably made of proper piezoelectric ceramic, such as PZT ceramic. The balanced filter unit may preferably include the piezoelectric resonator 101 using this piezoelectric thin film 103.

Preferably, the angle of intersection of the first and second interconnections 15 and 16 may be about 90°, for example. However, even in the case where the angle is not 90°, a similar advantage of improving isolation is obtainable.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. An acoustic wave duplexer comprising:
   a substrate;
   a reception acoustic wave filter chip; and
   a transmission acoustic wave filter chip; wherein
   the reception acoustic wave filter chip and the transmission acoustic wave filter chip are mounted on the substrate;
   the substrate includes first and second balanced terminals, a common terminal, and a signal terminal;
   each of the transmission acoustic wave filter chip and the reception acoustic wave filter chip includes at least one acoustic wave excitation electrode; and
   at least one of the transmission acoustic wave filter chip and the reception acoustic wave filter chip is a balanced filter unit that includes, as an input terminal or an output terminal, a first balanced signal end and a second balanced signal end;
   the acoustic wave duplexer further comprising:
   a first interconnection arranged to connect the balanced filter unit and the first balanced terminal and a second interconnection arranged to connect the balanced filter unit and the second balanced terminal; wherein
   the first balanced signal end of the balanced filter unit includes a junction of the balanced filter unit and the first interconnection, and the second balanced signal end thereof includes a junction of the balanced filter unit and the second interconnection; and
   the first and second interconnections intersect with each other and are insulated from each other.

2. The acoustic wave duplexer according to claim 1, wherein the substrate is provided with a portion where the first and second interconnections intersect with each other.

3. The acoustic wave duplexer according to claim 2, wherein the substrate is a laminated substrate in which a plurality of insulating layers are laminated, and the substrate further includes a plurality of conductive patterns spaced by a corresponding insulating layer of the laminated substrate disposed therebetween and a via hole conductor disposed so as to electrically connect at least two of the plurality of conductive patterns spaced by the corresponding insulating layer of the laminated substrate disposed therebetween.

4. The acoustic wave duplexer according to claim 1, wherein a portion where the first and second interconnections intersect with each other is provided at the balanced filter unit.

5. The acoustic wave duplexer according to claim 1, wherein each of the transmission acoustic wave filter chip and the reception acoustic wave filter chip is a balanced filter unit.

6. The acoustic wave duplexer according to claim 1, wherein the balanced filter unit includes:
   a piezoelectric substrate; and
   first and second longitudinally coupled resonator acoustic wave filters provided on the piezoelectric substrate, each of the first and second longitudinally coupled resonator acoustic wave filters including, as the acoustic wave excitation electrode, a first IDT and second and third IDTs arranged at both sides of the first IDT in an acoustic wave propagation direction and further including a pair of reflectors arranged at both sides of a region in which the first to third IDTs are disposed in the acoustic wave propagation direction; wherein the second IDTs of the first and second longitudinally coupled resonator acoustic wave filters are connected to each other;

the third IDTs of the first and second longitudinally coupled resonator acoustic wave filters are connected to each other;

a first bus bar of the first IDT of the second longitudinally coupled resonator acoustic wave filter includes a first balanced signal input/output unit; and a second bus bar of the first IDT of the second longitudinally coupled resonator acoustic wave filter includes a second balanced signal input/output unit.

7. The acoustic wave duplexer according to claim 6, wherein the first balanced signal input/output unit is connected to the first balanced signal end, and the second balanced signal input/output unit is connected to the second balanced signal end.

8. The acoustic wave duplexer according to claim 1, wherein the balanced filter unit comprises two balanced filter units provided on a piezoelectric substrate, the two balanced filter units being connected in parallel;

each of the two balanced units includes:
 first and second longitudinally coupled resonator acoustic wave filters provided on the piezoelectric substrate, each of the first and second longitudinally coupled resonator acoustic wave filters including, as the acoustic wave excitation electrode, a first IDT and second and third IDTs arranged at both sides of the first IDT in an acoustic wave propagation direction and further including a pair of reflectors arranged at both sides of a region in which the first to third IDTs are disposed in the acoustic wave propagation direction;
 the second IDTs of the first and second longitudinally coupled resonator acoustic wave filters are connected to each other;
 the third IDTs of the first and second longitudinally coupled resonator acoustic wave filters are connected to each other;
 a first bus bar of the first IDT of the second longitudinally coupled resonator acoustic wave filter includes a first balanced signal input/output unit; and
 a second bus bar of the first IDT of the second longitudinally coupled resonator acoustic wave filter includes a second balanced signal input/output unit; and the first balanced signal input/output units of both of the two balanced filter units are connected to the first balanced signal end, and the second balanced signal input/output units of both of the two balanced filter units are connected to the second balanced signal end.

9. The acoustic wave duplexer according to claim 1, wherein the balanced filter unit comprises two balanced filter units provided on a piezoelectric substrate, the two balanced filter units being connected in parallel;

each of the two balanced units includes:
 first and second longitudinally coupled resonator acoustic wave filters provided on the piezoelectric substrate, each of the first and second longitudinally coupled resonator acoustic wave filters including, as the acoustic wave excitation electrode, a first IDT and second and third IDTs arranged at both sides of the first IDT in an acoustic wave propagation direction and further including a pair of reflectors arranged at both sides of a region in which the first to third IDTs are disposed in the acoustic wave propagation direction;
 the second IDTs of the first and second longitudinally coupled resonator acoustic wave filters are connected to each other;
 the third IDTs of the first and second longitudinally coupled resonator acoustic wave filters are connected to each other;
 a first bus bar of the first IDT of the second longitudinally coupled resonator acoustic wave filter includes a first balanced signal input/output unit; and
 a second bus bar of the first IDT of the second longitudinally coupled resonator acoustic wave filter includes a second balanced signal input/output unit;

the first balanced signal input/output units of both of the two balanced filter units are connected to the first balanced signal end; and the second balanced signal input/output unit of either one of the two balanced filter units is connected to the second balanced signal end.

10. The acoustic wave duplexer according to claim 1, wherein the balanced filter unit comprises two balanced filter units provided on a piezoelectric substrate, the two balanced filter units being connected in parallel;

each of the two balanced units includes:
 first and second longitudinally coupled resonator acoustic wave filters provided on the piezoelectric substrate, each of the first and second longitudinally coupled resonator acoustic wave filters including, as the acoustic wave excitation electrode, a first IDT and second and third IDTs arranged at both sides of the first IDT in an acoustic wave propagation direction and further including a pair of reflectors arranged at both sides of a region in which the first to third IDTs are disposed in the acoustic wave propagation direction;
 the second IDTs of the first and second longitudinally coupled resonator acoustic wave filters are connected to each other;
 the third IDTs of the first and second longitudinally coupled resonator acoustic wave filters are connected to each other;
 a first bus bar of the first IDT of the second longitudinally coupled resonator acoustic wave filter includes a first balanced signal input/output unit; and
 a second bus bar of the first IDT of the second longitudinally coupled resonator acoustic wave filter includes a second balanced signal input/output unit;

the first balanced signal input/output unit of either one of the two balanced filter units is connected to the first balanced signal end; and the second balanced signal input/output units of both of the two balanced filter units are connected to the second balanced signal end.

11. The acoustic wave duplexer according to claim 1, wherein the balanced filter unit includes:

a piezoelectric substrate; and first and second longitudinally coupled resonator acoustic wave filters provided on the piezoelectric substrate, each of the first and second longitudinally coupled resonator acoustic wave filters including, as the acoustic wave excitation electrode, a first IDT and second and third IDTs arranged at both sides of the first IDT in an acoustic wave propagation direction and further including a pair of reflectors arranged at both sides of a region in which the first to third IDTs are disposed in the acoustic wave propagation direction, wherein the first balanced signal end is a portion of the first IDT or the second and third IDTs of the first longitudinally coupled resonator acoustic wave filter, the portion being connected to the first interconnection, the second balanced signal end is a portion of the first IDT or the second and third IDTs of the second longitudinally coupled resonator acoustic wave filter, the portion being connected to the second interconnection, and a phase of an output signal to an input signal in the second longitudinally coupled resonator acoustic wave filter differs by 180° from a phase of an output signal to an input signal in the first longitudinally coupled resonator acoustic wave filter.

12. The acoustic wave duplexer according to claim 1, wherein the balanced filter unit includes:

a piezoelectric substrate; and first to fourth longitudinally coupled resonator acoustic wave filters provided on the piezoelectric substrate, each of the first to fourth longitudinally coupled resonator acoustic wave filters including, as the acoustic wave excitation electrode, a first IDT and second and third IDTs arranged at both sides of the first IDT in an acoustic wave propagation direction, each of the first to fourth longitudinally coupled resonator acoustic wave filters further including a pair of reflectors arranged at both sides of a region in which the first to third IDTs are disposed in the acoustic wave propagation direction, wherein the first and third longitudinally coupled resonator acoustic wave filters are cascade connected, the second and fourth longitudinally coupled resonator acoustic wave filters are cascade connected, the first balanced signal end includes a portion of the first IDT or the second and third IDTs of the third longitudinally coupled resonator acoustic wave filter, the portion being connected to the first interconnection, the second balanced signal end includes a portion of the first IDT or the second and third IDTs of the fourth longitudinally coupled resonator acoustic wave filter, the portion being connected to the second interconnection, phases of an output signal to an input signal in three filters of the first to fourth longitudinally coupled resonator acoustic wave filters are the same, and the phases differ by 180° from a phase of an output signal to an input signal in the remaining one filter.

13. The acoustic wave duplexer according to claim 1, further comprising a transmission band-pass filter defined by a ladder acoustic wave filter.

14. The acoustic wave duplexer according to claim 1, wherein the acoustic wave duplexer has a structure arranged to utilize a surface acoustic wave and to define a surface acoustic wave device.

15. The acoustic wave duplexer according to claim 1, wherein the acoustic wave duplexer has a structure arranged to utilize a boundary acoustic wave and to define a boundary acoustic wave device.

16. The acoustic wave duplexer according to claim 1, wherein the balanced filter unit includes a piezoelectric resonator including a substrate, a piezoelectric film supported by the substrate and acoustically isolated from the substrate, and an upper electrode film and a lower electrode film as at least one of the acoustic wave excitation electrode, the upper electrode film and the lower electrode film being disposed such that the piezoelectric film is arranged therebetween.

* * * * *